(12) United States Patent
Lin et al.

(10) Patent No.: US 11,713,504 B2
(45) Date of Patent: *Aug. 1, 2023

(54) CHEMICAL RESISTANT MULTI-LAYER COATINGS APPLIED BY ATOMIC LAYER DEPOSITION

(71) Applicant: ENTEGRIS, INC., Billerica, MA (US)

(72) Inventors: I-Kuan Lin, Lexington, MA (US);
Carlo Waldfried, Middleton, MA (US);
Chandrasekaran Venkatraman, Tyngsboro, MA (US)

(73) Assignee: ENTEGRIS, INC., Billerica, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/840,367

(22) Filed: Jun. 14, 2022

(65) Prior Publication Data

US 2022/0316056 A1    Oct. 6, 2022

Related U.S. Application Data

(63) Continuation of application No. 16/223,723, filed on Dec. 18, 2018, now Pat. No. 11,390,943.

(60) Provisional application No. 62/599,865, filed on Dec. 18, 2017.

(51) Int. Cl.
   *C23C 16/40*   (2006.01)
   *C23C 16/455*  (2006.01)
   *C23C 16/44*   (2006.01)

(52) U.S. Cl.
   CPC .......... *C23C 16/405* (2013.01); *C23C 16/403* (2013.01); *C23C 16/4404* (2013.01); *C23C 16/45529* (2013.01); *C23C 16/45553* (2013.01)

(58) Field of Classification Search
   CPC ............ C23C 16/405; C23C 16/45553; C23C 16/403
   USPC ...................................................... 428/213
   See application file for complete search history.

(56) References Cited

U.S. PATENT DOCUMENTS

| | | |
|---|---|---|
| 4,552,851 A | 11/1985 | Hsieh |
| 7,671,001 B2 | 3/2010 | Skee |
| 2003/0232501 A1 | 12/2003 | Kher |
| 2005/0136188 A1 | 6/2005 | Chang |
| 2008/0008839 A1* | 1/2008 | Lee ................. C23C 28/42 427/404 |
| 2008/0254231 A1 | 10/2008 | Lin |
| 2009/0120457 A1 | 5/2009 | Naghshineh |
| 2009/0194233 A1 | 8/2009 | Tamura |
| 2010/0119843 A1 | 5/2010 | Sun |
| 2015/0122365 A1 | 5/2015 | Carr |
| 2016/0336210 A1 | 11/2016 | Cooke |
| 2016/0379806 A1 | 12/2016 | Xu |
| 2017/0234798 A1 | 8/2017 | Choi et al. |
| 2017/0314125 A1 | 11/2017 | Fenwick |
| 2018/0044800 A1 | 2/2018 | Hendrix |

(Continued)

FOREIGN PATENT DOCUMENTS

| | | |
|---|---|---|
| CN | 102575345 A | 7/2012 |
| CN | 103003923 A | 3/2013 |
| JP | 2016527707 A5 | 7/2017 |

(Continued)

*Primary Examiner* — Tahseen Khan

(57) ABSTRACT

Described are multi-layer coatings, substrates (i.e., articles) coated with a multi-layer coating, and methods of preparing a multi-layer coating by atomic layer deposition, wherein the coating includes layers alumina and yttria.

10 Claims, 1 Drawing Sheet

(56) References Cited

U.S. PATENT DOCUMENTS

2019/0100842 A1    4/2019  Hendrix

FOREIGN PATENT DOCUMENTS

| JP | 2016536785 | A5 | 11/2017 | | |
|---|---|---|---|---|---|
| KR | 20050094409 | A | 9/2005 | | |
| TW | 201030891 | A | 8/2010 | | |
| WO | 2009058275 | A1 | 5/2009 | | |
| WO | 2016131024 | A1 | 8/2016 | | |
| WO | WO-2016131024 | A1 * | 8/2016 | ......... | B01D 39/2027 |
| WO | 2017011315 | A3 | 9/2017 | | |

* cited by examiner

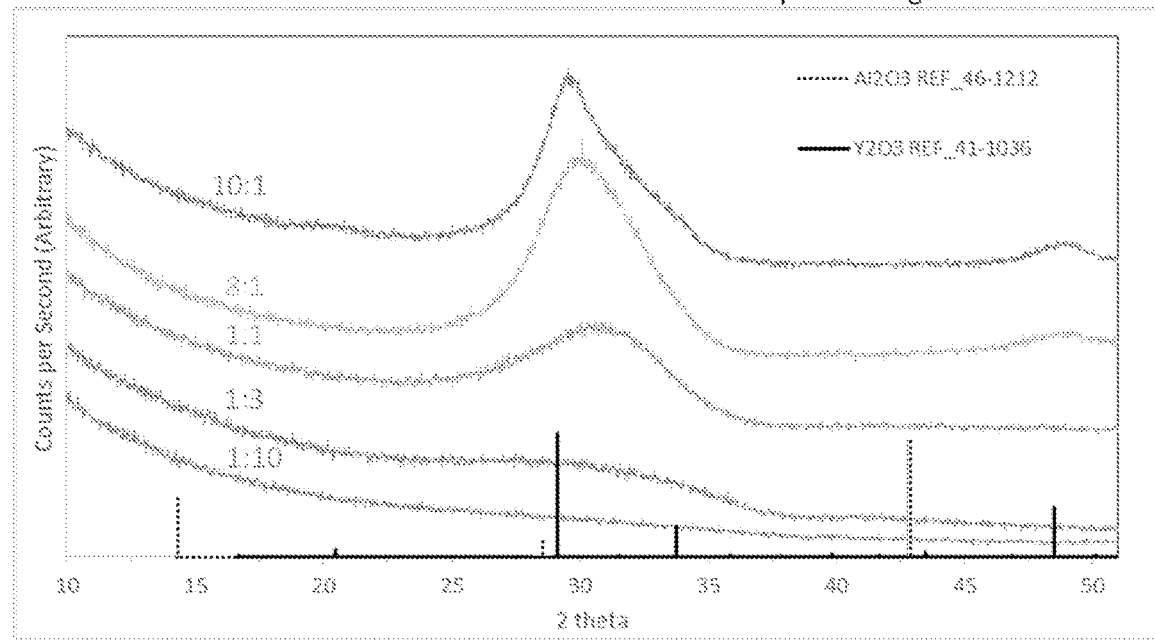

CHEMICAL RESISTANT MULTI-LAYER COATINGS APPLIED BY ATOMIC LAYER DEPOSITION

CROSS-REFERENCE TO RELATED APPLICATIONS

This application claims the benefit under 35 USC 119 of U.S. Provisional Patent Application No. 62/599,865, filed Dec. 18, 2017, the disclosure of which is hereby incorporated herein by reference in its entirety for all purposes.

FIELD OF THE INVENTION

The present description relates to multi-layer coatings applied by atomic layer deposition (ALD) methods, substrates having a multi-layer coating on a surface, and methods of preparing a multi-layer coating by atomic layer deposition, wherein the coating includes at least two layers of different deposited materials that include alumina and yttria.

BACKGROUND

Semiconductor and microelectronic device processing require steps that involve highly reactive process materials such as plasmas. Processes that involve these reactive process materials, for example plasma etching steps, plasma deposition steps, and plasma cleaning steps, are performed at an interior of a process chamber that contains a workpiece and the reactive process material. The process chamber also includes components (a.k.a. "reactor components") such as chamber walls, flow conduits (e.g., flow lines, shower heads, and the like), fasteners, trays, supports, and other structures that are used to support a workpiece or to deliver or contain a reactive process material relative to the process chamber. For use as part of a process chamber, reactor components should be resistant to the reactive process materials that will be used within the process chamber. The reactor components should not be degraded or damaged by the process materials, especially in a manner that would produce debris, particulates, or trace metal contaminants that may enter the process being performed or potentially contaminate a workpiece being processed.

Reactor components used in processes for fabricating semiconductor and microelectronic devices are frequently made of a base or substrate that is a metal or non-metal material such as stainless steel or anodized aluminum, or a mineral or ceramic material, etc. The reactor component substrate is usually coated with a thin film coating that has an increased resistance to reactive process materials, relative to the substrate material. In the past, such protective thin film coatings have typically been placed onto a substrate by various useful methods, typically by processes of anodizing (e.g., to produce anodized aluminum), spray coating, or physical vapor deposition (PVD).

SUMMARY

According to the present description, the coatings are multi-layer protective coatings applied to a substrate surface by atomic layer deposition, and include layers of at least two different deposited materials, including layers of amorphous alumina ($Al_3O_x$), and layers of yttria ($Y_yO_x$). Inventive coatings can be useful and potentially advantageous in their physical structure, performance as a protective coating, or both, relative to previous protective coatings, such as coatings applied by non-ALD methods, e.g., by PVD, or compared to comparable coatings (e.g., containing yttria, alumina, or a mixture of yttria and alumina) that may be prepared by ALD methods but are not prepared or structured in a manner that results in advantageous properties of example multi-layer coatings of the present description.

Accordingly, atomic layer deposition methods can be used to apply multi-layer coatings onto a substrate, with the multi-layer coatings having particularly useful physical properties, including one or more of: a useful or advantageous level of chemical resistance, and a useful or advantageous level of fracture resistance. For example, multi-layer coatings that include layers of yttria and layers of alumina, with the yttria layers being provided at a selected thickness or input ratio, can be very effective for use as protective coatings, and may exhibit one or more of the useful or improved physical properties or performance described herein. Moreover, a coating as described, applied by atomic layer deposition, can also have advantageous coating properties such as a highly uniform coating over a surface area, a reduced level of defects such as pinholes, cracks, fissures, and grain boundaries, and may be applied with these useful or desired properties on a surface that is three-dimensional and optionally that has a high aspect ratio. As opposed to certain other previous methods for forming protective coatings on a substrate (such as protective coatings used in a process chamber as described herein), e.g., anodizing, spray coating, and physical vapor deposition, can be achieved by use of atomic layer deposition to coat components of equipment that can be useful (among other applications) in the semiconductor and microelectronic device fabrication industries.

As compared to various other methods of producing thin film coatings, the present disclosure has disclosed that certain specific advantages can be achieved in a multi-layer coating prepared by ALD techniques. Advantageous properties of the described multi-layer coatings, achieved for example by preparing the multi-layer coating to include yttria layers of preferred thicknesses or input ratios, can include one or more of: a nano-crystalline structure which has less than 10 nm crystallite size (substantially amorphous); a desirable full-width at half-maximum (FWHM) of a coating's X-Ray diffraction (XRD) peaks is larger than 2.5 degree 2-theta; a high density of the coating (compared to previous protective coatings); low porosity (compared to previous protective coatings); and reduced levels of defects such as pinholes, cracking, fissures, or grain boundaries. In addition, the coatings formed by atomic layer deposition can also benefit from: excellent conformity of an ALD coating to a substrate (e.g., a three-dimensional substrate); accurate thickness control at small scales; large area uniformity of a coating over a surface; sharp interfaces vertically in a stack; effective and uniform application to surfaces that include non-planar structures such as apertures, channels, or passages of a high aspect ratio; and multilayer processing with the ability to prepare coatings of thin layers of multiple materials.

In one aspect the invention relates to chemically-resistant multi-layer protective coatings prepared by atomic layer deposition, the coatings comprising alternating layers of yttria and amorphous alumina.

In another aspect the invention relates to a coated article that includes a chemically-resistant multi-layer protective coating, prepared by atomic layer deposition and comprising alternating layers of yttria and amorphous alumina, coated onto a substrate, such as a vacuum stable substrate, e.g., for use as a reactor component a semiconductor or microelectronic device fabrication system such as a reaction chamber that is used for processing plasma.

In another aspect the invention relates to methods of using a coated article that includes a chemically-resistant multi-layer protective coating that is prepared by atomic layer deposition and that includes alternating layers of yttria and amorphous alumina, coated onto a substrate. The coated article can be used as a reactor component of a semiconductor or microelectronic device fabrication system such as a reaction chamber that is used for processing plasma.

BRIEF DESCRIPTION OF THE DRAWINGS

FIG. 1 is a graph showing x-ray diffraction data of multi-layer coatings of the present description.

DETAILED DESCRIPTION

The following describes: protective coatings in the form of thin multi-layer films applied to a substrate surface by atomic layer deposition; methods of applying the thin film coatings by atomic layer deposition; coated articles that include a substrate having the thin film coating applied to a surface or surfaces thereof; and methods of using the coated articles in processing equipment such as a component of a process chamber (a.k.a., "reactor" or "reaction chamber").

A protective coating as described herein, applied by atomic layer deposition, can be a multi-layer coating made to include layers of two different deposited materials including (for example) layers of yttria and layers of alumina. The coating is resistant to process materials, especially (but not only) to acids and plasmas that will be present in a process chamber during use of the process chamber for processes that are known or developed in the future, with certain example processes being described herein. The level of chemical resistance achieved by the presently-described multi-layer coatings can be highly useful or relatively improved as compared to levels of resistance achieved by previous of protective coatings. The type of chemical resistance and the level of resistance to different chemical materials can be a result of the types of materials of the multi-layer coating and the physical properties of the multi-layer coating such as density of the coating; crystallinity and crystal structure of the coating, porosity of the coating; a reduced presence of defects in the multi-layer coating; and properties (e.g., thicknesses) of the different layers of the multi-layer coating, especially thicknesses of yttria layers.

As an example, useful chemical resistance of a multi-layer coating can be achieved by the combined effects of alumina and yttria layers of the coating, especially yttria layers of preferred thicknesses or input ratios as described. Alumina provides effective or highly effective resistance to chlorine and bromine-based plasma exposure, such as can be demonstrated by exposure to hydrochloric acid. Resistance to other acids, including phosphoric acid, may also be expected. While the alumina layers of a multi-layer coating of the description provide a useful or highly effective level of resistance to these halogens, alumina may not have especially high resistance to fluorine-based plasma compositions. On the other hand, yttria layers can be included in a protective coating to provide useful or especially effective resistance to fluorine-based plasmas. Accordingly, multi-layer coatings of the present description, which include layers of alumina and layers of yttria in combination, can be useful to provide chemical resistance to various acid materials (based on the presence of the alumina layers), as well as to all halogen-based plasmas, including halogen-based plasmas such as fluorine-based plasmas (based on the presence of the yttria layers).

A coated article can include a substrate having the multi-layer coating applied to a surface of the substrate in a solid continuous form or in a patterned form. Examples of coated articles include items such as any of various reactor components of a process chamber that is used for preparing semiconductor materials, microelectronic devices, and the like. Being resistant to process materials such as acids and plasmas, the multi-layer coating can be used to protect components of the process chamber in the presence of these and other process materials. Preferred protective coatings have a low amount of defects such as cracks, fissures, pinholes, and grain boundaries, and are made of layers of deposited materials that are resistant to process materials; as a result, the coatings experience reduced amounts of degradation and particulation when exposed to a process material, compared to previous protective coatings.

As used herein the term "multi-layer" as in "multi-layer coating" refers to a coating that is applied to a surface by a series of atomic layer deposition steps, by exposing the surface to a sequence of gaseous precursor materials that will form multiple different and alternating "layers" of deposited materials. A "layer" may not be a complete or contiguous composition across the surface. If deposition produces incomplete individual layers, the multi-layer coating may be considered to be a composite coating. Each amount of deposited material (e.g., alumina or yttria) of the coating, alternatingly placed upon and between a different type of deposited material (e.g., yttria or alumina, respectively), is considered to be a "layer" whether a complete or an incomplete deposition occurs. A "bi-layer" film is made of only two different deposited materials, e.g., alternating layers of alumina and yttria. A "dual layer" is made of only two different layers.

By atomic layer deposition, each "layer" of a multi-layer film as described is formed from one or more monolayers of deposited material derived from gaseous precursors, such as an aluminum-containing precursor (including $AlCl_3$, $Al(CH_3)_3$, etc.) in combination with an oxidizer (including $O_2$, $O_3$, $H_2O$, $NO$, $NO_2$, $N_2O$, $CO$, $CO_2$, etc.). Each gaseous precursor includes a portion that will become deposited onto the substrate surface or onto a previously deposited ALD layer, e.g., at a "reaction site," to produce a "monolayer" of the deposited portion of the precursor to the surface. According to the present description, a series of atomic layer deposition steps is performed with different precursor materials to form at least two different types of layers (e.g., alternating layers) of deposited materials. Different precursors (e.g., $AlCl_3$ and $H_2O$) may be individually exposed to a surface, in successive ALD steps, to produce a single type or layer of deposited material (e.g., $Al_yO_x$).

Coatings as described are considered to include and are referred to as including multiple "layers" due to the multi-step process by which specified amounts of deposited materials are placed onto a substrate, such as in alternating sequences. The present description uses the term "multi-layer" to refer to a coating produced by multiple deposition steps by ALD, even though the discrete "layers" of different deposited materials of a coating may be challenging to identify by use of known techniques. In addition, as discussed above, a deposition step may form an incomplete layer (e.g., islands of deposited material) and, multiple steps would be considered to form a multi-layer coating as a composite of incomplete multiple "layers". In some multilayer coatings, discrete layers may be formed and may be detectable using a tunneling electron microscope.

As used herein the term "monolayer" refers to an amount of a deposited portion of a precursor that has been deposited onto (e.g., added to or reacted to) a surface of a substrate or to a previous ALD layer such that the deposited material saturates reaction sites on the substrate or previous ALD layer; a monolayer has a thickness of only a small number of atoms, i.e., a thickness of a single layer of atoms or molecules that cover the surface by associating with the limited number of reaction sites at the surface to produce a monolayer having a thickness of not more than about 2, 3, or 5, atoms.

Also as used herein, the term "layer" in describing a "layer" of deposited material of a multi-layer coating refers to a continuous or pulsed amount of a single type of deposited material derived by depositing one or multiple monolayers of deposited portions of precursors at a surface, i.e., that is a result of precursor materials being exposed to a surface and reacting with reaction sites of the surface to provide a desired deposited material that is a functional layer of the multi-layer protective coating, e.g., a "layer" of alumina or a "layer" of yttria; a "layer" of a deposited material (e.g., yttria or alumina) can be formed of one or multiple monolayers of deposited materials derived from two or more different gaseous precursor materials.

Preferred multi-layer coatings applied by atomic layer deposition have good conformability to surfaces of varied shapes or forms, including three-dimensional shapes that include channels, grooves, or openings such as structures having a relatively high aspect ratio, e.g., an aspect ratio of up to or greater than 20:1, 50:1, 100:1, 200:1, 500:1 or greater.

Preferred multi-layer coatings can also be applied using atomic layer deposition to exhibit a high level of coating thickness uniformity across a surface of the coating, especially when compared to coatings applied by other methods, such as by physical vapor deposition. Preferably the coating is compositionally uniform vertically through the thickness of the coating as well as across the length/width of the coating.

Preferred coatings also include low levels of coating defects such as cracks, fissures, pinholes, or grain boundaries, any one or more of which may be capable of becoming a larger defect over a period of use of the multi-layer coating in a process chamber. Defects such as pinholes, cracks, fissures, and grain boundaries can be identified by visual inspection, optionally with the use of magnification by means of an optical microscope or a scanning electron microscope, or by other suitable examination methods. Certain preferred multi-layer coatings of the present description can include substantially fewer pinholes (e.g., a 50, 70, 80, or 90 percent reduction in the amount of pinholes) as compared to previous protective coatings, applied by other methods, such as by physical vapor deposition, as a protective coating useful for a comparable purpose, such as a protective coating of a component of a process chamber as described. Examples of preferred protective coatings can include substantially no pinholes, and substantially no grain boundaries, meaning for example that the coating on average has fewer than one pinhole per square centimeter, and that the coating on average has fewer than one grain boundary per square centimeter, respectively.

Preferred multi-layer coatings of the present description exhibit advantageous levels of resistance to process materials used in a process chamber, including but not limited to acids and plasmas, especially over extended periods of exposure to process materials used in a process chamber. The high level of resistance to process materials can be attributed at least in part to factors that include the types (chemistry) of deposited materials used to prepare the different layers (e.g., yttria, alumina); low to no long range order (amorphous) of the film; the high quality of the film, meaning low levels of defects such as pinholes, cracks, fissures, and grain boundaries; and the low porosity and high density of the coating.

A "resistant" coating is a coating that, upon exposure to a process material such as an acid or a gas plasma, in a process chamber, during use of the process chamber, especially extended use over a period of weeks or months, experiences a commercially useful, low amount of degradation, including preferably, an amount that is consistent with or reduced relative to other protective coatings that have been used previously, for example relative to previous coatings used in a process chamber for processing a semiconductor or microelectronic device substrate, such as yttria or alumina coatings applied by physical vapor deposition (PVD). Preferred coatings of the present description can have advantageously long useful lifetimes as a protective coating in a process chamber, most preferably a useful lifetime that is significantly greater than such previous protective coatings. Degradation or lack of degradation of a protective coating may be determined using any of various techniques commonly used in the protective coating arts, including visual means such as optical or scanning electron microscopy wherein areas of cracks, fissures, or other defects are examined, or by evaluation of the strength of adhesion of the film to its substrate, where greater adhesion corresponds to less degradation.

Also preferably, a multi-layer film of the present description can have a relatively high density and low porosity relative to previous protective coatings for comparable uses (e.g., components of a process chamber), such as protective coatings of yttria or alumina applied by physical vapor deposition (PVD). For example, a density of an ALD coating that includes yttria and alumina layers, as described, can be at least 10 or 20 percent greater than a coating of comparable composition but applied by PVD. A porosity of an ALD coating that includes yttria and alumina layers, as described, can be less than a coating of comparable composition but applied by PVD. An alumina layer applied by ALD can have a density of a range of 3.0-4.0 grams per cubic centimeter and a porosity can be less than 0.5 percent.

Certain presently preferred multi-layer coatings deposited onto a substrate surface by atomic layer deposition can be bi-layer coatings that include alternating layers of only two different deposited materials: a first deposited material that is a substantially amorphous oxide such as alumina ($Al_yO_x$); and a second deposited material that is a layer of yttria ($Y_yO_x$). Particularly preferred coatings can contain layers of these two deposited materials, and substantially no layers made of any other material, e.g., less than 1, 0.5, or 0.1 percent of layers of other materials, based on the total number of layers of the coating. For example, preferred multi-layer coatings can contain from 2 to 10,000 total, alternating layers of yttria and alumina.

A multi-layer coating as described is applied by atomic layer deposition (ALD), which is a technique for depositing a thin layer of material (e.g., a thin film) onto a surface as a coating. The technique is performed as a series of gas phase deposition steps. Each deposition step involves one gaseous chemical reactant, typically referred to as precursor, presented to the surface in a manner to cause the gaseous reactant or a portion or derivative thereof to become deposited onto or to react with a material present at the surface. At least a portion of the precursor (i.e., a deposited portion) reacts with a material at the surface, at a reaction site, the number of which are present at the surface is limited. An amount of the precursor is supplied to the surface to allow reaction of the gaseous precursor with all of the reaction sites, at which point the deposited material is said to have formed a monolayer.

The one or more gaseous precursors are presented individually and sequentially to the surface to allow the precursor to react with or otherwise become deposited onto the surface, at reaction sites, as a deposited portion of the precursor. The process of the deposition is self-limiting with respect to the amount of precursor that can react with the reaction sites at the surface, and also with respect to the thickness of the monolayer, which is a function of factors that include the size of the atoms or molecules being deposited and the nature of the surface to which the precursor is applied including the number of reaction sites. Through repeated and consecutive exposures of the surface to different precursors in individual deposition steps, a thin film coating made of multiple layers of different deposited materials (each layer optionally being formed by multiple deposition steps and multiple deposited monolayers) can be grown onto the surface, with each layer being a deposited material that is formed by selectively depositing one or more specific precursors. For comparison, other known techniques for depositing thin films or coatings of materials onto a surface include chemical vapor deposition (CVD) and physical vapor deposition (PVD), which are processes that deposits material onto a surface as a thin film coating in a continuous, steady-state fashion, during which the deposited material forms a film that increases in thickness continually during the extent of the deposition process.

By atomic layer deposition techniques, a gas phase precursor reacts at a reaction site at a surface of a substrate onto which the precursor is being deposited. The reaction is limited by the presence of the reaction sites at the surface because the gas phase atoms or molecules of the precursor can react with only the finite number of reactive sites on the surface. Once all those sites have been consumed, a "monolayer" has been formed and the deposition and growth of the monolayer end, including growth of the thickness of the monolayer. The amount of the deposited material (the deposited portion of the precursor) that has been deposited onto the surface is referred to a monolayer, which has a characteristic thickness of up to a few to several Angstroms thick, and based on being applied by ALD, has a very uniform thickness across the area of the monolayer (assuming a continuous layer is formed).

Advantages that can be achieved with a multi-layer protective coating prepared by atomic layer deposition, applied to a substrate of the present description, include excellent conformity of a coating to the substrate; accurate control of the thickness of the coating; high uniformity of the thickness of the coating over an area of the coating; the ability to apply two or more different deposited materials as different layers of a coating; compositional uniformity vertically throughout the coating; the preparation of coatings to have very low levels of defects such as pinholes, cracks, fissures, and grain boundaries; the ability to prepare a coating having a high density and a low porosity; and the ability to place a coating having these physical properties onto a substrate that includes non-planar, highly-shaped, angled structures or structures that include openings, channels, trenches, or the like, including such structures that have a high aspect ratio.

In a first example step of atomic layer deposition, a first gaseous precursor material (e.g., $AlCl_3$) is presented to a surface of a substrate in a reaction chamber (a.k.a., "reactor"). Atoms or molecules of the first gaseous precursor react at sites on the surface until all of the sites have been consumed, at which point a monolayer of the deposited portion of the precursor has been formed on the surface and growth of the monolayer ends. The thickness of the monolayer is accordingly controlled and is determined by the number of reaction sites available for the precursor atoms or molecules, as well as the size of the deposited portion of the precursor atoms or molecules. In a subsequent step, a second precursor (e.g., an oxidizer, such as water) may be introduced into the reaction chamber to react with the previously-deposited monolayer to form a new monolayer at the surface of the previously-deposited monolayer. As a result of one or more of these types of deposition steps, a deposited material (e.g., $Al_yO_x$) is formed on the surface. Multiple sequences of these steps to deposit a series of monolayers, causing a series of reactions at the surface that produce the deposited material, can increase the thickness of the layer of deposited material.

As desired, between the deposition of two monolayers, or between steps of deposition of different types of precursors to form layers of two different deposited materials, the gaseous atmosphere in the reaction chamber may be flushed (or "purged") to remove remaining precursor atoms or molecules, e.g., using an inert gas.

Growth (i.e., an increase in thickness) of a multi-layer protective coating prepared by atomic layer deposition proceeds in a monolayer-by-monolayer sequence, and in a layer-by-layer sequence. Each layer of a deposited material (e.g., alumina or yttria) is formed by placing one or more monolayers at the surface in a manner that forms the deposited material of the layer, optionally including a chemical reaction between precursor materials. To produce each monatomic or monomolecular layer (monolayer), the dosing of a precursor needs to be uniformly delivered to the substrate surface to achieve saturation of the substrate surface reaction sites. Saturation occurs when all available surface bonding sites are filled with new chemical species originating from the reaction between the precursor and a surface bonding site. The resulting surface does not create new bonding sites for the precursor being used, but instead, bonding sites for a next precursor are formed. After saturation, the surface may be exposed to a different precursor (to continue to form a desired layer of a deposited material), or may be treated to re-create new bonding sites. As desired, the process chamber may be flushed to remove residual precursor. By alternating the presentation to a substrate of a first series or sequence of precursor materials useful to form a first type of deposited material (e.g., alumina), with a second series or sequence of precursor materials (different from the first set or series) useful to form a second type of deposited material (e.g., yttria), in alternating cycles, with optional flushing steps between cycles, a thin multi-layer coating can be produced that includes alternating layers of the two different deposited materials, with each layer being of a desired or controlled thickness.

A precursor for use in atomic layer deposition can be selected to provide useful and efficient deposition of a desired material (deposited material), or a reactant thereof, onto a surface, to form a layer of deposited material. Generally, a precursor atom or molecule can be one that will chemisorb onto the surface of the substrate to which the precursor material is applied, or will react with a deposited material of a previously-deposited monolayer. A precursor may be in the form of a solid, liquid, or gas that can be volatilized to a gaseous form that can be effectively introduced as a vapor into a reaction chamber and to a substrate surface. The vapor pressure of the precursor need not be excessively high, as long as the gaseous precursor provides a sufficient flux of material for surface saturation. For example, a precursor may be useful if it can be provided in gaseous form at a vapor pressure of about 1 torr at a temperature at which the precursor does not decompose. A useful precursor should not react with itself and should be stable enough to not decompose on the surface or in the gas phase, so as to achieve self-terminating surface reactions.

Preferably, a multi-layer protective coating as described can be a multi-layer (e.g., bi-layer coating or a composite coating) thin film formed by atomic layer deposition of materials that comprise, consist essentially of, or consist of a first deposited material and a second deposited material. A preferred first deposited material is alumina in a substantially amorphous form, i.e., AlyOx (with y/x in a range from 1.5/3 to 2.5/3). A preferred second deposited material is yttria, meaning YyOx (with y/x in a range from 1.5/3 to 2.5/3). A multi-layer coating that "consists essentially of" layers of two different deposited materials, e.g., layers of yttria and substantially amorphous alumina, refers to a coating that includes layers of only the two different deposited materials and not more than 1, 0.5, or 0.1 percent of any layers of another material based on the total number of layers of the coating; such a coating is also referred to herein as a "bi-layer" coating.

Alumina as a layer of the multi-layer coating can provide a high level of resistance to certain process chemicals such as acids, and can be deposited by atomic layer deposition in a substantially amorphous form, e.g., the FWHM of coating's XRD peaks is wider than 4 degree 2-theta, i.e., non-crystalline form.

An example thickness of a layer of amorphous alumina can be at least 1 angstrom, and may be applied to be thicker than 1 angstrom, e.g., to have a thickness in a range from 1 to 50 angstroms, as desired. An alumina layer may be substantially amorphous over a range of thicknesses. A thickness of an alumina layer may be selected, however, based on other factors, such as to provide the multi-layer coating with a desired level of resistance to certain process materials to which alumina may be particularly resistant, for example to increase resistance of the multi-layer protective coating to acids. Thicknesses of 100 nm can be prepared.

The second deposited material of a multi-layer protective coating can be yttria. The yttria can preferably be deposited onto a substrate so that the yttria layer, and the protective coating as a whole, provide a relatively high level of resistance to process materials such as acids and plasmas, as well a relatively high fracture resistance and a reduced presence of grain boundaries and other defects.

A preferred multi-layer coating can include layers of yttria that are deposited onto alumina at a thickness (of the yttria layer) that will cause the yttria layer to adopt and retain the morphology of the alumina layer. The alumina layer, being amorphous, provides an amorphous base onto which a yttria layer can be applied, that will encourage the formation of yttria in non-crystalline form. By applying the yttria layer to an amorphous alumina layer, the yttria layer, if applied at an effective thickness, will tend to be non-crystalline, thereby producing a substantially non-crystalline multi-layer coating that exhibits desired physical properties as described, including chemical resistance, fracture resistance, and an absence of grain boundaries and other defects. Thus, the use of amorphous alumina as a deposited material of a layer of the multi-layer coating can be preferred as a way to improve the ability to deposit yttria in a non-crystalline form, allowing for a low level of crystallinity of the total multi-layer coating. For this reason, a first layer of a multi-layer coating that is applied to a surface of a substrate can preferably be a deposited material that naturally tends to be highly amorphous, e.g., alumina.

Referring to FIG. 1, this graph shows data from testing examples alumina-yttria bi-layer ALD coatings as described herein, with the example coatings having different input ratios (atomic) of yttria: alumina, ranging from 10:1 to 1:10. Details relating to the samples that were prepared are shown in Table 1.

TABLE 1

| Input Y/Al Ratio | Composite Coating Cycles | Composition (at %) | | | Measured Y/Al Ratio |
| --- | --- | --- | --- | --- | --- |
| | | Y | Al | O | |
| 0.91 (10:1) | 10Y-cycle + 1 Al-cycle | 23.8 | 2.5 | 73.7 | 0.90 |
| 0.89 (8:1) | 8Y-cycle + 1 Al-cycle | 20.7 | 7.7 | 71.6 | 0.73 |
| 0.5 (1:1) | 1Y-cycle + 1 Al-cycle | 11.2 | 22.0 | 66.8 | 0.34 |
| 0.25 (1:3) | 1Y-cycle + 3 Al-cycle | 6.4 | 30.9 | 62.7 | 0.17 |
| 0.09 (1:10) | 100(1Y-cycle + 10 Al-cycle) | 1.9 | 39.0 | 59.1 | 0.05 |

Thus, for example, a coating having a target input Y/Al ratio of 1:10 was prepared from 1 ALD deposition cycle using yttria-producing precursors followed by 10 ALD deposition cycles using alumina-producing precursors. Y/Al ratio is defined as at % Y/(at % Y+at % Al) and thus assumes the oxygen is equally distributed between yttria and alumina in the coating. The measured Y/Al ratios were determined by energy dispersive X-ray spectroscopy (EDAX). Similar measurements were performed using X-ray fluorescence (XRF) and X-ray diffraction (XRD). Results for 1:1 Y/Al sample are shown in Table 2. Differences between measured values reflects limitations/features of the technique and would be expected by ones skilled in the art.

TABLE 2

| Measurement Technique | Measured Y/Al Ratio |
| --- | --- |
| EDAX | 0.35 |
| XRF | 0.45 |
| XPS | 0.6 |

Thus, the multi-layer coating having a target input Y/Al ratio of 1:1 would be considered to have a measured Y/Al ratio in a range of between about 0.35 and about 0.6 (about 1:2 to about 2:1).

The test was performed by X-ray diffraction (XRD) using a grazing incidence attachment to only detect X-rays diffracted from the films surface as known in the relevant art. The graphs shows counts per second relative to 2 theta. The test results, as shown at the graph of FIG. 1, demonstrate that by increasing thickness of a yttria layer, the peaks become sharper. The sharper peak indicates higher level of long range order with larger crystallite size. Referring to FIG. 1, 10:1 (Yttria:Alumina) has 2.501 deg 2θ of FWHM indicating that it has 33 Å crystallite size. 8:1 has 3.793 deg 2θ of FWHM indicating it has 22 Å crystallite size. The FWHM of 1:1, 1:3 1:10 is wider than 4 deg 2θ which indicates that the bi-layers are amorphous.

Surprisingly, it has been found that multi-layer ALD coatings of yttria and alumina, having an input Y/Al ratio of 1:1 (and a measured Y/Al ratio of from 2:1 to 1:2) have significantly reduced crystallinity compared to coatings with higher Y/Al ratios. Amorphous multi-layer coatings would be preferred in a variety of applications. Accordingly, surprisingly it has been found that the yttria layers can be deposited onto amorphous alumina layers to have a thickness that allows the layers of yttria to be substantially non-crystalline (e.g., less than 10, 5, or 1 percent crystalline as measured by x-ray diffraction) or ultra-low level crystallinity (i.e., amorphous), e.g., such that the FWHM of a coating's XRD peaks is wider than 2 degree 2-theta. Relatively thinner yttria layers will be less prone to forming crystalline structures as compared to relatively thicker yttria layers—i.e., an increase in thickness of a yttria layer increases the likelihood that the yttria will form crystals. Yttria layers that are sufficiently thin to maintain a low level of crystallinity of individual yttria layers, and of an entire multi-layer coating that contains the yttria layers, are, therefore preferred. Example thicknesses of a yttria layer of a preferred multi-layer coating as described can be a thickness that causes the yttria to be substantially amorphous, with specific ranges being, e.g., in a range from 6 to 12 angstroms, typically in a range from about 8 to 10 angstroms.

According to example protective coatings of the invention, the multi-layer coating is substantially non-crystalline or ultra-small crystalline. Preferred multi-layer coatings can have less than 10 nm crystalline size, i.e., the FWHM of coating's XRD peaks is wider than 2 degree 2-theta.

A total thickness of a multi-layer coating as described, such as a coating that is formed of alternating layers of (non-crystalline) yttria and amorphous alumina, can be any thickness that provides desired properties as described herein, including good resistance to process materials, high uniformity of the thickness of the coating over an area of the coating, low defects, high density, low porosity, low crystallinity, high compositional uniformity, etc. An example of a useful thickness for use of the multi-layer coating as a protective coating on a component of a process chamber may be at least 10 nanometers (i.e. at least 0.01 micron), for example at least 100 nanometers (0.1 micron) and as thick as 2 microns, preferably not greater than 1.0 micron.

The relative amounts of yttria ($Y_yO_x$) and alumina ($Al_yO_x$) in a multi-layer coating can be selected to provide desired features of the protective coating as described herein, such as one or more of: desirable resistance to process chemicals; a desired low level of crystallinity (and grain boundaries) of the multi-layer coating; desirably high density and low porosity; a low level of defects; and other useful and preferred features of a multi-layer coating as described. Examples of relative amounts of yttria and alumina in multi-layer coatings that comprise, consist of, or consist essentially of substantially amorphous alumina and substantially amorphous or non-crystalline yttria can be in a range from about 1:50 to 50:1, with preferred relative amounts of $Al_yO_x$: $Y_yO_x$ being, for example, in a range from 1:15 to 12:1, e.g., from 1:15 to 10:1.

Consistent with these examples of relative amounts of yttria ($Y_yO_x$) and alumina ($Al_yO_x$), the relative thicknesses of yttria ($Y_yO_x$) layers and alumina ($Al_yO_x$) layers can be selected to provide desired properties and a desired balance of properties as described herein, such as one or more of: desirable resistance to process chemicals, a desired low level of crystallinity (and grain boundaries) of the multi-layer coating; desirably high density and low porosity, and other useful and preferred features of a multi-layer coating as described. Often, all layers of each type of deposited material of a coating will be selected to be approximately the same thickness; all alumina layers will be about the same thickness, and all yttria layers will be about the same thickness, but the thickness of the yttria layers can be different from the thickness of the alumina layers. The thickness of each deposited material layer can be selected to provide desired (low) crystallinity of the yttria, and high resistance to certain process components. A multi-layer coating as described can include layers of yttria ($Y_yO_x$) and alumina ($Al_yO_x$) layers that have any relative thicknesses, e.g. from 1:50 to 50:1. This FIGURE may be used to describe individual layers of a multi-layer coating, or to describe the total combined thickness of all layers of a multi-layer coating. In certain particular embodiments, the relative thicknesses of these two layers ($Al_yO_x$:$Y_yO_x$) (individual or combined) may be in a range from 1:15 to 12:1, e.g., from 1:15 to 10:1.

Also, consistent with these relative amounts of yttria ($Y_yO_x$) and alumina ($Al_yO_x$), and the relative thicknesses of layers of yttria ($Y_yO_x$) and alumina ($Al_yO_x$) in a multi-layer coating, a multi-layer coating can have relative atomic amounts of yttrium and aluminum that are effective to provide a multi-layer coating as described, preferably including desired features and combinations of features as described. In example coatings, relative atomic amounts of yttrium (as part of the yttria of yttria layers) to aluminum (as part of the alumina of alumina layers) (Y(atomic):Al (atomic)) can be from 1:50 to 50:1, e.g., from 1:10 to 10:1.

Methods of atomic layer deposition that are effective for preparing a useful or preferred multi-layer coating as described, e.g., of alternating layers of deposited materials of amorphous yttria and amorphous alumina, can be performed using any of a variety of useful precursors and process conditions that will be effective to provide a multi-layer coating as desired, and by use of known and commercially available ALD equipment, process conditions, and techniques. Example ALD processes can be performed by a series of steps that includes individual steps of depositing, in a reaction chamber, a gaseous precursor, onto a substrate surface, to form a monolayer of the precursor material on the surface. A second monolayer of a second precursor may be deposited onto (e.g., react with) the first monolayer, e.g., to form a layer of deposited material. The cycle of applying these two precursors to form the deposited material can be repeated to increase the thickness of the layer of deposited material.

As an example, to form a layer of alumina, a first precursor such as $AlCl_3$ can be introduced to a surface to react with the surface and provide an aluminum atom (with attached chlorine atoms) attached to the surface; a second precursor (e.g., water, ozone, oxygen) can be introduced to the surface to replace the chlorine atoms with oxygen atoms to form alumina ($Al_yO_x$). An alternate example of an aluminum-containing precursor is trimethylaluminum (TMA). Multiple cycles of these two depositions step can be performed in an alternating sequence to produce a layer of alumina with increasing thickness. Preferably, as an initial layer of a multi-layer film of alumina and yttria, the alumina layer can be deposited first, before a yttria layer, so that the amorphous nature of the alumina acts to prevent the subsequently-applied yttria layer from being formed to include a crystalline structure. A processing temperature can be selected to allow the alumina to be effectively deposited.

As an example of a step to form a layer of yttria, a yttrium-containing precursor (e.g., Y(thd)$_3$ wherein thd=2,2,6,6-tetramethyl-3,5-heptanedionato) can be introduced to a surface to react with the surface (preferably a previously-applied ALD deposited amorphous material such as amorphous alumina) and provide a yttrium atom (with attached thd groups) at the surface. A second precursor (e.g., water, ozone, oxygen) can be introduced to the surface to replace the thd groups with oxygen atoms to form yttria ($Y_yO_x$). An alternate example of an yttrium-containing precursors is tris(cyclopentadienyl)yttrium(III) (YCp$_3$). Multiple cycles of these two depositions step can be performed in an alternating sequence to produce a layer of yttria with increasing thickness. A processing temperature can be selected to allow the yttria to be effectively deposited in a substantially amorphous state.

These individual deposition steps, or sequences of steps to form a layer of a single deposited material such as alumina or yttria, can be performed in combination with other intermediate such as steps of flushing the reaction chamber to purge remaining gaseous precursor.

A multi-layer coating as described can be formed on and useful with any surface or substrate upon which a layer or monolayer of material may be effectively applied by atomic layer deposition. In particular embodiments, a substrate may be made of a vacuum stable substrate material, and may be in the form of a component of a process chamber that is used to process substrates, materials, or devices by use of one or more different process materials that are highly reactive, corrosive, or otherwise capable of aggressively degrading or reacting with other materials, including internal components of a process chamber. In this context, a multi-layer protective coating as described can be advantageously applied to a substrate that is referred to herein as a "vacuum compatible substrate," and that is formed to function as a component of a process chamber used to process microelectronic devices, semiconductor equipment and devices, etc., by treatment with a process material such as a plasma.

A process chamber is useful to contain highly corrosive or reactive process materials that may be in the form of a liquid, gas, or plasma, used, for example, for etching materials of a microelectronic device substrate or semiconductor device substrate during a step of manufacturing a microelectronic or semiconductor device. Particular examples of reactive process materials include bromine plasma, chlorine plasma, and fluorine plasma, among others. The process chamber must contain components and surfaces that are useful to transport, hold, secure, support, or move a substrate into, out of, and within the process chamber, without being unduly degraded by process materials that will be present in the process chamber. The process chamber must also contain a system of structures that is effective to flow, deliver, and remove the reactive process materials (e.g., plasma) to and from the interior of the process chamber. Examples of these different types of process chamber components include flow heads (shower heads), shields, trays, supports, nozzles, valves, conduits, stages for handling or holding a substrate, wafer handling fixtures, chamber liners, ceramic wafer carriers, wafer holders, susceptors, spindles, chucks, rings, baffles, and various types of fasteners (screws, nuts, bolts, clamps, rivets, etc.).

Preferred coatings of the invention can be particularly useful for preparing coating articles that are useful in a process chamber as a process chamber component. This includes this type of articles generally, having any shape, but also, advantageously, includes articles that have a physical shape or form that includes an opening, aperture, channel, tunnel, a threaded screw, a threaded nut, a porous membrane, a filter, a three-dimensional network, a hole, a channel, or the like, including such features that are considered to have a high aspect ratio. Atomic layer deposition of amorphous coatings as described, unlike previous methods of depositing comparable coatings, can be effective to provide a uniform and high quality coating on such structures, including articles having structures with an aspect ratio of at least 20:1, 50:1, 100:1, 200:1, or even 500:1.

A chamber component can be made from a material, referred to as a substrate, that can preferably be a vacuum-compatible substrate. Generally, examples can include ceramic materials, metals, and a metal alloys that can be coated with a protective coating and used in a process chamber. Examples of ceramic materials that can be useful as a vacuum-compatible substrate include alumina, silicon carbide, and aluminum nitride. Examples of metals and metal alloys include stainless steel and aluminum. Vacuum-compatible substrates can also be quartz, sapphire, silica, fused silica, fused quartz, silicon, anodized aluminum, zirconium oxide, as well as plastics such as certain plastics used in the semiconductor industry, e.g., as polyether ether ketone (PEEK) and polyimides.

While the present description refers often to process chambers and process chamber components (e.g., etch chamber components) as useful substrates for a protective coating as described, the described coatings are not limited to these items. Various other ceramic, mineral, metal, and metal alloy articles and substrates that would benefit from a protective coating having a high level of resistance to highly reactive chemical materials can also be coated as described herein.

Accordingly, the invention relates to the described multi-layer coatings; coated articles and devices that include a substrate (e.g., a process chamber component) coated with a multi-layer coating as described; equipment and devices such as a reaction chamber or other process equipment (including but not limited to semiconductor processing equipment) that includes one or more components with a protective multi-layer coating as described; and processes and methods of using a reaction chamber or other process equipment that includes one or more components that have been coated with a protective multi-layer coating as described, for processing a substrate such as a semiconductor device or microelectronic device using the reaction chamber or process equipment, for example by treating the substrate with plasma. Examples of such processing include plasma etching (e.g., dry plasma etching) using plasmas such as those that are derived from $NF_3$, $Cl_2$, $CHF_3$, $CH_2F_2$, $SF_6$ and HBr.

What is claimed is:

1. A method of applying a coating to a substrate, comprising:
   depositing, by atomic layer deposition, amorphous alumina on a substrate; and
   depositing, by atomic layer deposition, yttria having a crystallinity of less than 10% on the substrate,
   wherein the coating of has a measured Y/Al ratio in a range from 2:1 to 1:2.

2. The method of claim 1, wherein the coating has a thickness in a range from 0.01 to 1.0 micron.

3. The method of claim 1, wherein the coating is a composite coating of yttria and amorphous alumina.

4. The method of claim 1, wherein the coating has substantially no grain boundaries.

5. The method of claim 1, wherein the coating has substantially no pinholes.

6. The method of claim 1, wherein the substrate is a reactor component of a microelectronic device or semiconductor manufacturing system.

7. The method of claim 1, wherein the substrate is a vacuum-compatible substrate.

8. The method of claim 1, wherein the substrate comprises a wall surface of a plasma etch chamber, a wafer susceptor, a chuck, a showerhead, a liner, a ring, a nozzle, a baffle, a fastener, a wafer support, a wafer transport structure, or a portion or component of any one or these.

9. The method of claim 1, wherein the substrate includes a three-dimensional feature selected from a threaded screw, a threaded nut, a porous membrane, a filter, a three-dimensional network, a hole, and a channel.

10. The method of claim 1, wherein the substrate includes a three-dimensional structure having an aspect ratio of at least 20:1.

\* \* \* \* \*